United States Patent
Howarth

(10) Patent No.: US 8,030,825 B2
(45) Date of Patent: Oct. 4, 2011

(54) PIEZOELECTRIC GENERATOR AND METHOD

(75) Inventor: Thomas R. Howarth, Portsmouth, RI (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 525 days.

(21) Appl. No.: 12/284,479

(22) Filed: Sep. 19, 2008

(65) Prior Publication Data

US 2011/0127881 A1    Jun. 2, 2011

(51) Int. Cl.
  *H01L 41/113* (2006.01)
(52) U.S. Cl. .......................... 310/339; 310/329
(58) Field of Classification Search ............ 310/329, 310/339
See application file for complete search history.

(56) References Cited

U.S. PATENT DOCUMENTS

| | | | |
|---|---|---|---|
| 6,407,484 B1* | 6/2002 | Oliver et al. | 310/339 |
| 6,438,242 B1* | 8/2002 | Howarth | 381/190 |
| 6,798,122 B1* | 9/2004 | Howarth et al. | 310/344 |
| 2005/0012434 A1* | 1/2005 | Pizzochero et al. | 310/339 |
| 2007/0063621 A1* | 3/2007 | Haswell et al. | 310/339 |

* cited by examiner

*Primary Examiner* — Derek Rosenau
(74) *Attorney, Agent, or Firm* — James M. Kasischke; Michael P. Stanley; Jean-Paul A. Nasser

(57) ABSTRACT

An apparatus and method is provided to produce energy from movement of a user. At least one pair of plates is utilized to secure an array of cymbal transducers therebetween. The array of cymbal transducers is electrically interconnected with signal conditioning circuitry and power storage member. Electrical interconnections may comprise parallel and/or series connections between ones or groups of the cymbal transducers.

17 Claims, 3 Drawing Sheets

PIEZOELECTRIC GENERATOR AND METHOD

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER PATENT APPLICATIONS

None.

BACKGROUND OF THE INVENTION (1) Field of the Invention

The present invention relates generally to electric energy generation from mechanical sources and, more particularly, to a transducer module that is optimized to generate electrical energy from environmental, mechanical, and mechanical compression forces that otherwise could not be used.

(2) Description of the Prior Art

While piezoelectric materials have been successfully utilized in sensors and actuators, their use as practical power sources for generating a useful amount of electricity in portable generators has been limited. Users of piezoelectric devices are presently substantially limited to operating only very low power devices, such as LEDs. This operation is typically limited to only a brief flash.

For practical use, the inventor believes that to power portable electrical devices, it would be necessary that electricity be generated using a large number of piezoelectric transducers. Preferably, such a system would be able to store power generated over a period of time. Thus, a practical system would require signal conditioners such as rectifiers and power storage, such as batteries. The need for a large number of piezoelectric transducers with many interconnections between components such as rectifiers and batteries increases the weight, reduces the robustness, and increases the complexity and difficulty of packaging such devices, especially for purposes such as being carried on a person, device, or object. Moreover, a practical system should be adaptable for capturing energy produced by different types of motions, with different amounts of force or translational movement. The prior art does not address the above problems.

The following U.S. patents describe various prior art systems that may be related to the above and/or other transducer module systems.

U.S. Pat. No. 5,955,790, issued Sep. 21, 1999, to North, discloses a power transfer system for generating electrical energy from recurring wave and tidal movement within the ocean. The system comprises a pressure sensing device, such as an array of pressure transducers, positioned at the ocean floor below water level and at a location of wave movement for (i) registering changes in height of water above the pressure sensing device and (ii) providing a power output corresponding to changes in force associated with the changes in the height of water. A transfer medium is coupled at one end to the pressure sensing device and extends underground to a second end at a shore location adjacent the location of wave movement for transmitting the power output of the pressure sensing device to the shore location. A bank of storage batteries is coupled to the transfer medium at the shore location for receiving the power output from the transfer medium and for storing the power output as a useful form of energy.

U.S. Pat. No. 6,438,242, issued Aug. 20, 2002, to Howarth, discloses an electro-acoustic transducer in which a plurality of cymbal-type electro-acoustic actuators are disposed in mechanical and electrical parallel between a pair of stiff plates. The resultant transducer resonates at a lower frequency than the cymbals, with a greater generated force. An example of a plurality of cymbal type transducers is shown in FIG. 1.

U.S. Pat. No. 6,737,789, issued May 18, 2004, to Radziemski, et al., discloses a force activated electrical power generator using piezoelectric elements of preferred lead-magnesium-niobate lead titanate (PMN-PT). The circuitry is in preferred versions completely passive generating all power needed. Some circuitry limits voltage across the elements and provides a return charge channel to prevent depolarization. Transformers can be used to increase the output voltage and efficiency. Rectifiers are shown to rectify the output to a single polarity. Filtering, regulation and other conditioning components are also shown. The output from the generator and circuitry can store the electrical charge, such as in a capacitor and/or battery.

U.S. Pat. No. 7,157,802, issued Jan. 2, 2007, to Bodkin, discloses an electrical power source that derives input power from a compressed gas which is fed into a transducer, generating electrical power. The compressed gas may be delivered to the unit by several means including manual pumps, thermal, chemical, or ammunition based sources, or connection to pressurized canisters. Optional power converting and feedback circuits and pneumatic valves serve to convert the raw output power into useful AC and DC output voltages, and to match the rate of power delivery to the applied electrical load.

U.S. Pat. No. 7,239,066, issued Jul. 3, 2007, to Ott, et al., discloses a piezoelectric power generator that comprises a plurality of piezoelectric devices, an actuator positioned to impart an excitation to the plurality of piezoelectric devices in a predefined sequence, and an electrical conduction system connected to the plurality of piezoelectric devices for conducting an electrical charge created by the excitation. Preferably, the plurality of piezoelectric devices are arranged in a predetermined relationship relative to the actuator whereby only one of the plurality of piezoelectric devices is actuated at a time. For example, the plurality of piezoelectric devices can be arranged in an angular pattern (such as a circular pattern) relative to the actuator. Preferably, a rotational speed of the actuator (24) permits an excitation response for a given piezoelectric device to essentially fully decay before the given piezoelectric device is again excited.

U.S. Pat. No. 7,260,984, issued Aug. 28, 2007, to Roundy, et al., discloses a method of powering one or more electronic devices in a tire monitoring system using a tire pressure based energy scavenger. With this method, a tire is rotated on a surface to generate pressure changes within the tire. These pressure changes are then converted into electrical energy with a transducer and the energy is stored. The electrical energy or stored electrical energy can then be used to power one or more electronic devices in a tire monitoring system, such as a tire pressure sensor, temperature sensor, acceleration profile sensor, and/or a tire wear monitor. A tire monitoring system with a tire pressure based energy scavenger is also provided.

International Application No. PCT/US05/35683, published Apr. 13, 2006, to Raisanen, discloses methods for analyzing characteristics of fluids in the context of an acoustic ejection system. Such a system has a controller, an acoustic radiation generator, and a coupling medium coupling the radiation to a reservoir holding fluid. The methods can use acoustic radiation to both perturb a surface of the fluid in the reservoir and analyze the effect of the perturbation. The methods may use information about prior fluids. The methods of the invention can determine physical characteristics such as speed of sound and viscosity. The methods also include ways to determine a level of acoustic energy suitable to eject a droplet.

The above cited prior art does not disclose a module system that is optimized to generate electrical energy from mechanical and environmental sources, specifically compressive forces, where an array of cymbal transducers is positioned between two rigid plates that are electrically conductive and are coupled to any of the cymbal transducers that are adjacent thereto. Signal conditioning electronics can be coupled to the electrically conductive portions of the plates, and a battery can be connected to the signal conditioning electronics.

As discussed above, solutions to the above described and/or related problems have been long sought without success. Consequently, those skilled in the art will appreciate the present invention that addresses the above and other problems.

SUMMARY OF THE INVENTION

It is a general purpose of the present invention to provide an improved method and apparatus for generation of electrical energy from environmental, mechanical, and mechanical compression forces that otherwise could not be used.

An object of the present invention is to provide an improved method and apparatus for piezoelectric transducer arrays adapted for harvesting energy from periodic compressive forces.

Accordingly, the present invention provides a method and apparatus for producing energy from movement of a user. Steps of a method in accord with one possible embodiment of the invention may comprise providing at least one pair of plates and securing an array of cymbal transducers between the pair of plates.

In one possible embodiment, the method may comprise integrating power storage such as a battery or capacitor into the plates. Signal conditioning circuitry may also be integrated into the plates. The plates may be provided with a flexible portion, wherein the power storage and/or signal conditioning circuitry may be mounted.

The method may comprise mounting stops throughout the array of cymbal transducers to prevent over compression of the array of cymbal transducers.

In one embodiment, the method may comprise mounting the plurality of cymbal transducers in staggered orientation between the pair of plates.

The method may comprise connecting wires to the battery for powering an outside device using the harvested energy.

In one presently preferred embodiment, the apparatus may comprise at least one pair of plates and an array of cymbal transducers adapted for harvesting energy from periodic compressive forces secured between the plates. A series of stop members can be mounted between the plates to limit movement. The pair of plates and array of cymbal transducers therein may be mountable with respect to the user to move in response to the movement of the user to thereby produce the energy. The apparatus may comprise the battery and/or signal conditioning circuitry integrated into at least one pair of plates.

In one possible embodiment, the method may comprise integrating a power storage and/or signal conditioning circuitry into the plates.

The apparatus may comprise a flexible portion of at least one of the plates wherein power storage and/or signal conditioning circuitry may be mounted.

The apparatus may comprise wires or other power conductors connected to the battery for powering an outside device using the harvested energy.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DESCRIPTION OF THE INVENTION

The present invention may be utilized for harvesting electrical energy from environmental, mechanical, and mechanical compression forces that otherwise could not be used.

Figure 1:
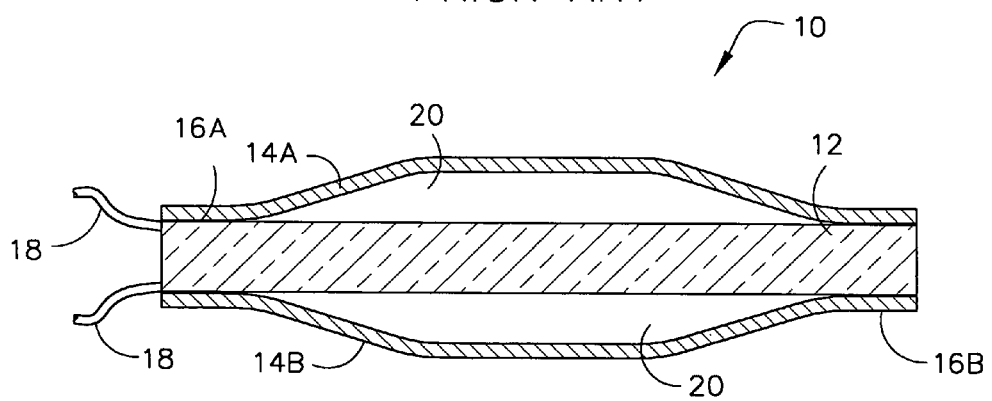
FIG. 1 is a cross-sectional view showing a single enlarged cymbal transducer in accord with one possible embodiment of the present invention.

FIG. 1 illustrates an enlarged view of a type of transducer that is referred to herein as cymbal transducer 10, which may be utilized in accord with the present invention. Transducer 10 has a disk 12 of piezoelectric material. Piezoelectric material can be a single crystal or multi-crystal PZT or the like formed in a disk shape. Cymbals 14A and 14B are joined to top and bottom surfaces 16A and 16B of disk 12. Cymbals 14A and 14B are made from a rigid material that supports elastic deformation. This material can be a metal, a rigid plastic, and/or other suitable material.

Electrical contacts 18 are joined to each surface of disk 12. If made of metal, cymbals 14A and 14B can provide this electrical contact. However, cymbals 14A and 14B can be used to provide mechanical to support electrical contacts, such as wires and the like, regardless of the material of which cymbals 14A and 14B are comprised. There is a gas-filled gap 20 between each cymbal 14A and 14B and the surface of disk 12.

Figure 2:
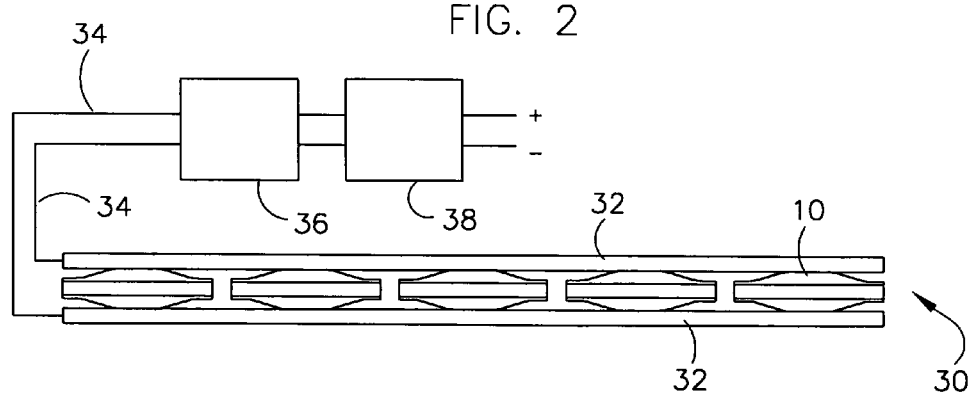
FIG. 2 is a cross-sectional view showing an array of cymbal transducers, a pair of plates, a battery, and signal conditioning circuitry, in accord with one possible embodiment of the present invention.

FIG. 2 illustrates components of a working piezoelectric generator in accord with the present invention. Array 30 of cymbal transducers 10 positioned between two rigid plates 32 whereby electricity may be produced simultaneously from a large number of cymbal transducers 10. Plates 32 can be conductive or can have conductive members formed thereon to capture electrical energy generated by compression of cymbal transducers 10. Each plate 32 is joined to a conductive element 34. Conductive elements 34, such as wires, power busses, and the like, are joined to signal conditioning circuitry 36. Typical signal conditioning circuitry 36 can include a rectifier, bridge rectifier, or the like, for changing the provided alternating electrical current to conditioned direct current at a desired voltage and current. If desired, more complex signal conditioning circuitry may also be used such as transformers, voltage doublers or triplers. Signal conditioning circuitry is joined to a power storage device such as battery 38 to provide the conditioned direct current for charging. Battery 38 can then be used to provide a steady output to power outside devices. Other power devices such as capacitors or the like may also be charged.

Figure 3:
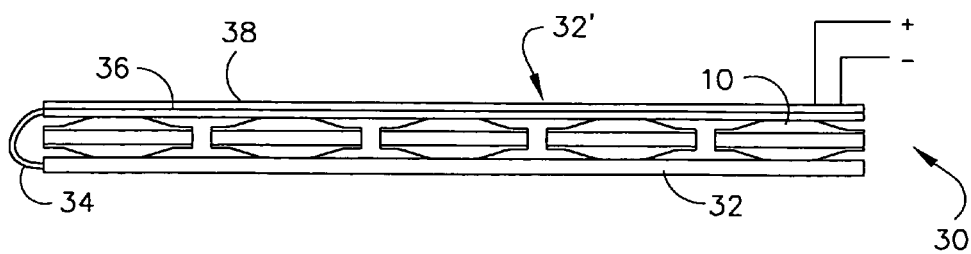
FIG. 3 is a cross-sectional view of an array of cymbal transducers having the battery and signal conditioning circuitry integrated into at least one of the plates, in accord with one possible embodiment of the present invention.

FIG. 3 illustrates another possible embodiment wherein signal conditioning circuitry 36 and battery 38 are embodied in a rigid plate 32'. Circuitry 36 may be flex circuitry or some other circuitry joined to or formed within a rigid, but thin substrate. Flex circuitry may refer to any known type of available flex circuitry such as, for example, flat flexible circuits, rigid flexible circuits, polymer thick film flex circuits, flex membranes, and the like. Battery 38 can be any kind of rigid thin battery known in the art. Battery 38 could also be a supercapacitor or some other sort of energy storage device as driven by the demands of the application. This embodiment is more compact than that shown in FIG. 2. Size may be a critical factor in many of the uses of this device. Connections 34 may be made internally of the array but are shown externally for convenience.

Figure 4:
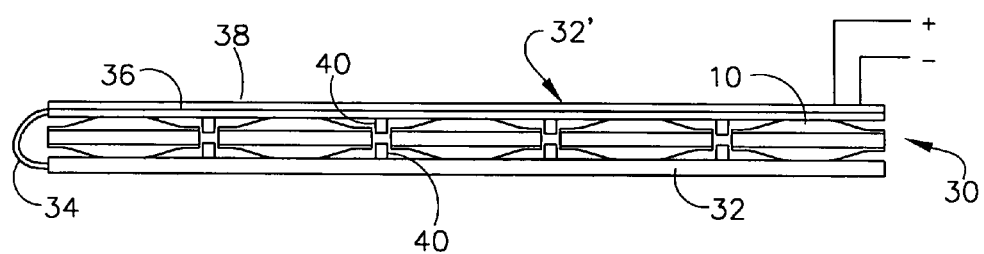
FIG. 4 is a cross-sectional view of an array of cymbal transducers having stops mounted between the plates, in accord with one possible embodiment of the present invention.

FIG. 4 illustrates another embodiment of the invention. This embodiment includes stops 40 joined to plates 32 and 32'. Stops 40 are positioned among the cymbal transducers 10 to prevent over-compression of the cymbals, thereby preventing damage and extending the life of array 30. Height of stops 40 should be sufficient to preserve cymbal deformation within the elastic range of the cymbal material. This embodiment may be useful where forces produced by the user, such as the feet during running or walking, may sometimes be quite large.

Figure 5:
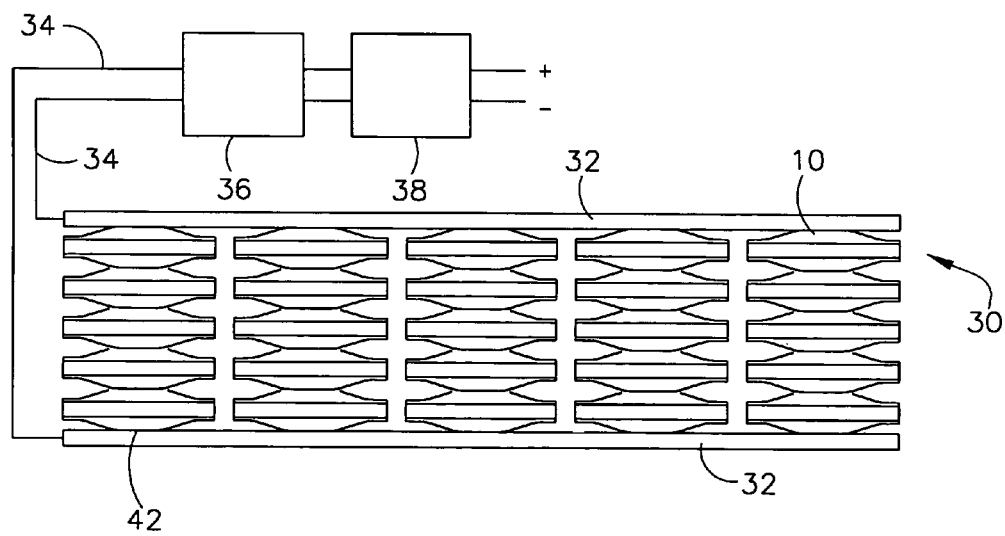
FIG. 5 is a cross-sectional view of an arrangement of cymbal transducers arranged in columns, in accord with one possible embodiment of the present invention.

FIG. 5 illustrates an embodiment of the invention having a serial arrangement of cymbal transducers 10. In this embodiment, transducers 10 are arranged in a plurality of columns 42. Each of the columns comprises a plurality of cymbal transducers 10 stacked on top of each other. Compression of plates 32 compresses all transducers 10 in each column and may compress all columns 42. While the plates contact only the uppermost and lowermost transducers 10, the force acting on those transducers is also applied to the middle transducers 10 in each stack. This embodiment allows for a longer power or force stroke to capture energy produced thereby.

Wiring to interconnect the transducers may connect the transducers in parallel if greater current output is desired or in parallel to increase the voltage output. In one possible embodiment, outputs of cymbal transducers 10 for each column 42 may be connected in series and the resulting outputs of each column 42 may be connected in parallel. For example, if metal material is utilized for cymbals 14A and 14B as shown if FIG. 1, then this metal material may also be utilized to complete the circuit to provide a series connection between outputs of cymbal transducers 10 in each column. If plates 32 are metal, then the outputs of each column 42 are then in parallel.

Other wiring arrangements might also be utilized. To produce a relatively higher voltage, cymbal transducers 10 for each column may be connected in series as discussed above, and then the outputs of each column 42 may be connected in series with interconnecting wires between plates 32. In this manner, the voltage produced may be equal to the voltage output of each cymbal transducer multiplied by the number of transducers in an array.

Figure 6:
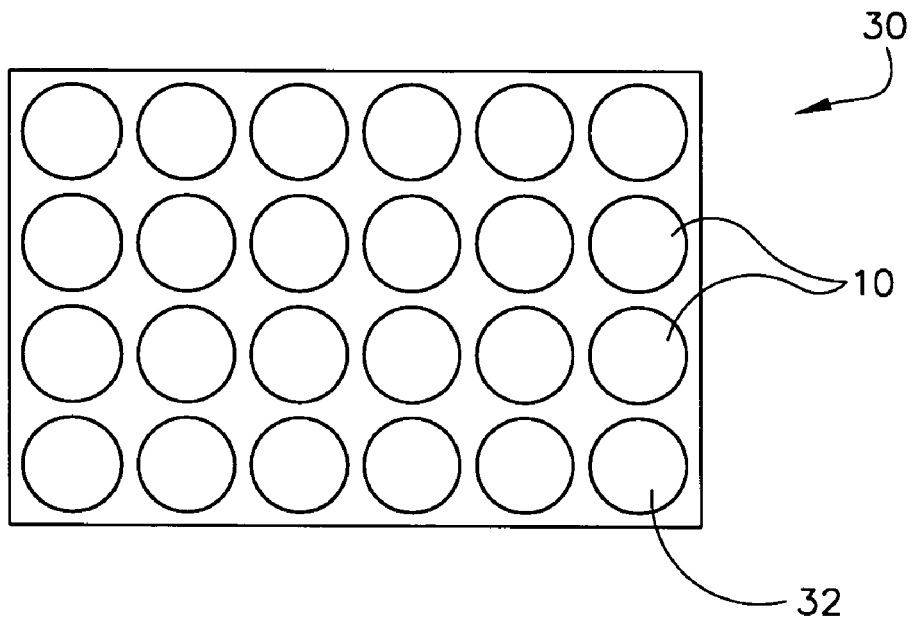
FIG. 6 is a top view, showing disc shaped cymbal transducers in a linear serial arrangement, in accord with one possible embodiment of the present invention.

FIG. 6 illustrates an embodiment of the invention showing a two or three-dimensional array of cymbal transducers 10. In this embodiment, transducers 10 are arranged so that all rows of transducers are centered on parallel lines in both the x and y directions as seen from the top. Transducers 10 may comprise a depth or columns of transducers as shown from the side in FIG. 5 to capture a long stroke. Alternatively, only one or a few transducers 10 may be utilized for a short stroke of applied force or power.

Figure 7:
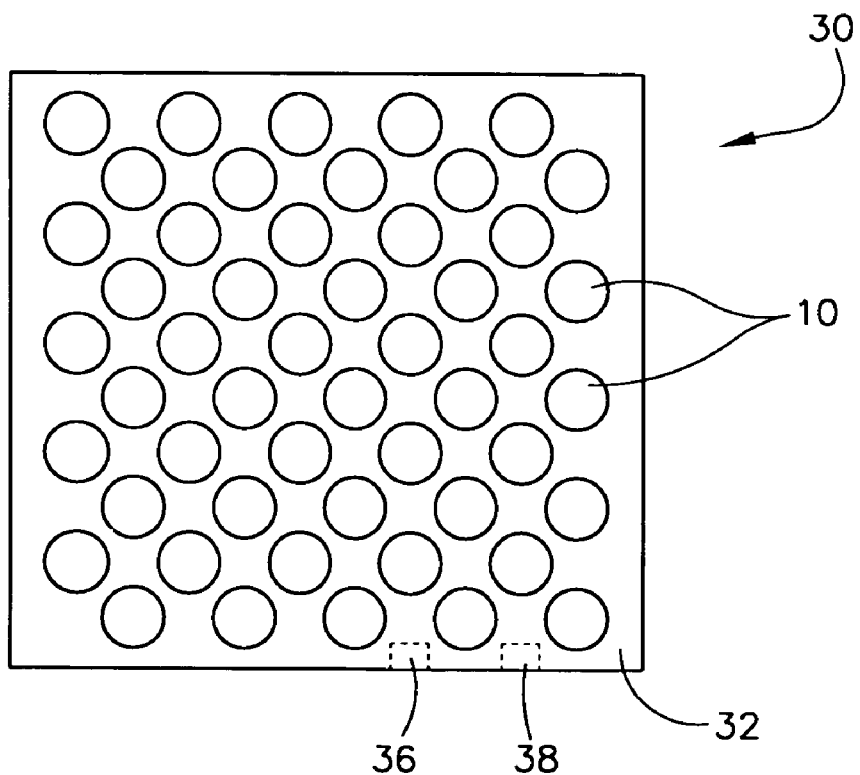
FIG. 7 is a top view, showing disc shaped cymbal transducers in a staggered serial arrangement, in accord with one possible embodiment of the present invention.

FIG. 7 illustrates an embodiment of the invention showing a staggered configuration for a two or three-dimensional array of cymbal transducers 10. In this embodiment, transducers 10 may spaced so that adjacent rows of transducers are offset from each other. In FIG. 7, the signal conditioning circuitry 36 and battery 38 are shown to be separately integrated into the apparatus. The dark section of FIG. 7 in the top right hand corner may represent the combination of the circuitry 36 and/or battery 38 integrated into the apparatus. However, circuitry 36 and/or batter 38 may be integrated into various positions.

Further embodiments of this invention are envisioned that involve parallel and serial arrangements of cymbal transducers that could be tailored to the specific use. Serial arrangements can provide power when larger forces and translations are available. Larger transducers are more suited to low frequency usage. Cymbal transducer size can vary with the use.

It is suggested that this invention can be used in remote locations where electrical power is difficult to provide to a device. Two suggested applications are for capturing energy generated during walking and as a manual squeeze power source.

In summary, the present invention provides a method and apparatus for producing and harvesting energy from movement of a user that otherwise could not be used. In the preferred embodiment, steps of the method may comprise providing at least one pair of plates. In one possible embodiment, the method can comprise integrating a battery and signal conditioning circuitry into at least one of the pair of plates and/or securing an array of cymbal transducers between the pair of plates. The method may also comprise providing that the array of cymbal transducers is adapted for harvesting energy from periodic compressive forces. It is provided that the pair of plates and array of cymbal transducers therein are mountable with respect to the user to move in response to the movement of the user to thereby produce the energy. The array is optimized to generate electrical energy from environmental, mechanical, and especially mechanical compression forces, where a system of an array of cymbal transducers is positioned between two rigid plates that are electrically conductive and are coupled to any of the cymbal transducers that are adjacent thereto. Signal conditioning electronics are coupled to the electrically conductive portions of the plates, and a battery can be connected to the signal conditioning electronics.

The present invention may be mounted in the heel of a boot, provided as a hand carried device, or implemented as a mat in commonly used devices such as chairs, sleeping bags, or the like. The present invention may be adapted to simultaneously provide cushioning for the user and to generate electricity. The present invention may be adapted to be operated by the legs while standing or laying or by the user's arms. The two-dimension and three-dimensional structures of the array are readily adaptable to many shapes and may be sewn into position or mounted into position, such as the heel of boots.

Many additional changes in the details, components, steps, and organization of the system, herein described and illustrated to explain the nature of the invention, may be made by those skilled in the art within the principle and scope of the invention. It is therefore understood that within the scope of the appended claims, the invention may be practiced otherwise than as specifically described.

What is claimed is:

1. A method of producing energy from movement of a user, comprising:
   providing at least one pair of plates;
   securing an array of cymbal transducers between said at least one pair of plates;
   integrating power storage and signal conditioning circuitry into said at least one pair of plates;
   mounting stops between said at least one pair of plates to prevent over compression of said array of cymbal transducers;
   electrically interconnecting said array of cymbal transducers with said power storage and signal conditioning circuitry; and
   adapting said at least one pair of plates and said array of cymbal transducers therein to be positionable with respect to said user to produce said energy.

2. The method of claim 1, further comprising:
   providing that said array of cymbal transducers comprises a plurality of stacks of cymbal transducers; and
   electrically interconnecting said array of cymbal transducers such that respective outputs of said plurality of stacks are in a parallel-connected electrical circuit.

3. The method of claim 1, further comprising electrically interconnecting said array of cymbal transducers such that at least a portion of respective electrical outputs from individual cymbal transducers are in a series connected electrical circuit.

4. The method of claim 1, comprising providing that said array is a three-dimensional array of cymbal transducers.

5. The method of claim 1, comprising providing a flexible portion of at least one of said pair of plates.

6. The method of claim 5, integrating said signal conditioning circuitry in said flexible portion of said at least one of said pair of plates.

7. The method of claim 1, comprising arranging said plurality of cymbal transducers in a staggered orientation between said at least one pair of plates.

8. An apparatus for producing and storing energy from periodic forces, comprising:
   at least one pair of plates defined as a first plate and a second plate;
   a series of stops mounted between said at least one pair of plates, the series of stops including a first stop mounted to the first plate and a second stop mounted to the second plate and having a gap therebetween, the first stop and the second stop being positioned to interfere with each other and resist further movement of the first plate with respect to the second plate after a predetermined amount of compression has been applied to said at least one pair of plates; and
   an array of cymbal transducers secured between said at least one pair of plates, said array of cymbal transducers between said at least one pair of plates being adapted for harvesting energy from periodic forces whereby said at least one pair of plates and said array of cymbal transducers are mountable with respect to said forces to compress and expand and thereby produce said energy.

9. The apparatus of claim 8, wherein:
   said array of cymbal transducers comprises a plurality of stacks of cymbal transducers; and
   electrical interconnections between said array of cymbal transducers such that respective outputs of said plurality of stacks are in a parallel-connected electrical circuit.

10. The apparatus of claim 8, wherein a portion of at least one of said plates is flexible.

11. The apparatus of claim 10, comprising at least one of a power storage and signal conditioning circuitry integrated into said flexible portion.

12. The apparatus of claim 8, further comprising signal conditioning circuitry integrated into at least one of said plates.

13. The apparatus of claim 12, further comprising a power storage integrated into at least one of said plates.

14. The apparatus of claim 8, comprising said array being organized as a three-dimensional array of cymbal transducers.

15. The apparatus of claim 8, further comprising electrical connections between said array of cymbal transducers such that respective outputs of at least a portion of individual cymbal transducers are in a parallel-connected electrical circuit.

16. The apparatus of claim 8, further comprising signal conditioning circuitry electrically joined to said array of cymbal transducers.

17. The apparatus of claim 16, further comprising a power storage electrically joined to said signal conditioning circuitry.

* * * * *